(12) United States Patent
Furuhashi et al.

(10) Patent No.: US 8,168,950 B2
(45) Date of Patent: May 1, 2012

(54) CHARGED PARTICLE BEAM APPARATUS, AND IMAGE GENERATION METHOD WITH CHARGED PARTICLE BEAM APPARATUS

(75) Inventors: Kanji Furuhashi, Hitachinaka (JP); Shuji Kikuchi, Yokohama (JP); Akira Karakama, Hitachinaka (JP); Yasuhiro Gunji, Hitachiota (JP)

(73) Assignee: Hitachi High-Technologies Corporation, Tokyo (JP)

( * ) Notice: Subject to any disclaimer, the term of this patent is extended or adjusted under 35 U.S.C. 154(b) by 265 days.

(21) Appl. No.: 12/273,805

(22) Filed: Nov. 19, 2008

(65) Prior Publication Data

US 2009/0134340 A1 May 28, 2009

(30) Foreign Application Priority Data

Nov. 22, 2007 (JP) .................................. 2007-302488

(51) Int. Cl.
*H01J 37/28* (2006.01)
(52) U.S. Cl. ........................................ 250/310; 250/307
(58) Field of Classification Search .................. 250/310, 250/307, 492.1, 492.2, 492.21, 492.22, 492.23, 250/492.24, 492.3; 324/754.22
See application file for complete search history.

(56) References Cited

U.S. PATENT DOCUMENTS

| | | | |
|---|---|---|---|
| 5,502,306 A | 3/1996 | Meisburger et al. | |
| 6,184,526 B1 * | 2/2001 | Kohama et al. | 250/310 |
| 6,538,248 B1 | 3/2003 | Kametani et al. | |
| 7,012,251 B2 * | 3/2006 | Nakasuji et al. | 250/310 |
| 7,129,485 B2 * | 10/2006 | Nakasuji et al. | 250/310 |
| 8,063,363 B2 * | 11/2011 | Yeh et al. | 250/307 |
| 2002/0179851 A1 | 12/2002 | Sato et al. | |
| 2006/0210144 A1 | 9/2006 | Yamaguchi et al. | |

FOREIGN PATENT DOCUMENTS

| | | |
|---|---|---|
| JP | 05-258703 | 10/1993 |
| JP | 2000-057985 | 2/2000 |
| JP | 2000-100362 | 4/2000 |
| JP | 2006-107870 | 4/2006 |
| JP | 2006-108123 | 4/2006 |
| JP | 2006-261162 | 9/2006 |

OTHER PUBLICATIONS

Japanese Office Action issued in Japanese Patent Application No. 2007-302488 dated Jan. 4, 2012.
Japanese Office Action, with partial English translation, issued in Japanese Patent Application No. 2007-302488, dated Jan. 4, 2012.

* cited by examiner

*Primary Examiner* — Jack Berman
(74) *Attorney, Agent, or Firm* — McDermott Will & Emery LLP (57) ABSTRACT

The present invention has a subject to provide an apparatus that optimizes scanning in accordance with circumstances or purposes, reduces distortion of images, and improves throughput, image quality, and defect detection rate by controlling deflection of a charged particle beam in a stage tracking system. To solve this subject, an apparatus according to the present invention is an inspection apparatus for detecting abnormal conditions of an inspection target by irradiating the inspection target with the charged particle beam and detecting generated secondary electrons, including both a stage that moves continuously with the inspection target placed thereon and a deflection control circuit for providing a deflector with a scanning signal that causes the charged particle beam to scan repeatedly in a direction substantially perpendicular to a stage movement axis direction while the charged particle beam being deflected in the stage movement axis direction in accordance with a change in movement speed of the stage during movement of the stage.

10 Claims, 9 Drawing Sheets

Scanning direction X

Direction of movement of Y stage (b)

CHARGED PARTICLE BEAM APPARATUS, AND IMAGE GENERATION METHOD WITH CHARGED PARTICLE BEAM APPARATUS

FIELD OF THE INVENTION

The present invention relates to a technology for inspecting a substrate having a fine pattern such as a semiconductor device and liquid crystal for defects, and in particular, relates to a charged particle beam apparatus that inspects a pattern on a substrate for defects by irradiating the substrate with a charged particle beam and detecting a secondary signal generated from the substrate, and to an image detecting method with the charged particle beam apparatus.

BACKGROUND OF THE INVENTION

An inspection of a semiconductor wafer is taken as an example of substrate for a description below. A semiconductor device is manufactured by repeating a process of transferring a pattern formed on a photo-mask to a semiconductor wafer by lithography processing and etching processing. Quality of lithography processing, etching processing and other processing and an occurrence of foreign matter in a manufacturing process of semiconductor devices have a great influence on fabrication yields of semiconductor devices. Therefore, various devices for inspecting patterns on semiconductor wafers in the manufacturing process are used to detect an occurrence of abnormal conditions or defects in the manufacturing process at an early stage or in advance.

As methods for inspecting defects present in patterns on a semiconductor wafer, a defect inspection device that irradiates a semiconductor wafer with light and compares circuit patterns of the same type of a plurality of LSIs using optical images, and a defect inspection device that irradiates a semiconductor wafer with a charged particle beam such as an electron beam and detects generated secondary electrons or reflected electrons to convert a signal thereof to images before detecting defects, have been put in practical use.

Known is a charged particle beam apparatus for defect inspection employing a Scanning Electron Microscope (SEM), which improves throughput thereof by adopting a stage tracking system that makes a charged particle beam scan while a target to be inspected being continuously moved (for example, Japanese Patent Application Laid-Open Publication No. 05-258703). However, the movement direction of the stage and the scanning direction are predetermined and the degree of freedom when an image is acquired is low and therefore, there remain problems of both action to be taken when distortion of an image occurs and difficulty in improving throughput.

SUMMARY OF THE INVENTION

In a conventional charged particle beam apparatus, as described above, throughput of image acquisition is improved by performing a scan of a charged particle beam while the stage being continuously moved. An object of the present invention is to provide a charged particle beam apparatus that optimizes scanning in accordance with situations and purposes, reduces distortion of images, and improves throughput, image quality, and defect detection rate by controlling deflection of a charged particle beam in the stage tracking system.

According to an embodiment of the present invention, an inspection apparatus for detecting abnormal conditions of an inspection target by irradiating the inspection target with a charged particle beam and detecting generated secondary electrons includes a stage that moves continuously with the inspection target placed thereon and a deflection control circuit which provides a deflector with a scanning signal that causes the charged particle beam to scan repeatedly in a direction substantially perpendicular to a stage movement axis direction while the charged particle beam being deflected in the stage movement axis direction (the direction of stage movement or the opposite direction thereof) in accordance with a change in movement speed of the stage during movement of the stage.

According to the present invention, a charged particle beam apparatus that reduces distortion of images and improves throughput, image quality, and defect detection rate by exercising deflection control of a charged particle beam in the movement axis direction in accordance with a change in movement speed of an inspection target can be obtained.

DESCRIPTION OF THE REFERENCE NUMERALS

1: circuit pattern inspection apparatus
2: inspection chamber
3: electron-optical column
4: optical microscope chamber
5: image processing part
6: interface
7: secondary electron detection part
8: sample chamber
9: inspected substrate
10: electron gun
11: electron beam induction electrodes
12: condensing lens
13: blanking deflector
14: diaphragm
15: scanning detector
16: objective lens
17: reflector
18: E×B deflector
19: primary electron beam
20: secondary electron detector
21: preamplifier
22: AD converter 23: light conversion means
24: optical transmission means
25: electrical conversion means
26: high-voltage power supply
27: preamplifier driving power supply
28: AD converter driving power supply
29: reverse bias power supply
30: sample stand
31: X stage
32: Y stage
33: rotation stage
34: position monitor length measuring machine
35: inspected substrate height measuring device
36: retarding power supply
40: light source
41: optical lens
42: CCD camera
43: scanning signal generator
44: objective lens power supply
45: storage unit
46: image processing circuit
47: defect data buffer
48: operation part
49: overall control part
55: map display part
56: image display part
58: image processing instruction area
59: processing condition setting instruction part
60: mode switching button
61: correction control circuit
101: inspection stripe
102: chip
103: cell
104: plug
201: deflecting view field
202: center
203: monitoring screen
204: stage speed change display part
205: Y deflection amount change display part
206: irradiation interval change display part
207: speed numeric information display part
208: distance numeric information display part
209: interval numeric information display part
210: condition instruction screen
211: tracking mode selection part
212: setting value input part
213: automatic setting function start button

DETAILED DESCRIPTION OF THE PREFERRED EMBODIMENTS

An embodiment of the present invention will be described in detail below with reference to drawings.

Figure 1:
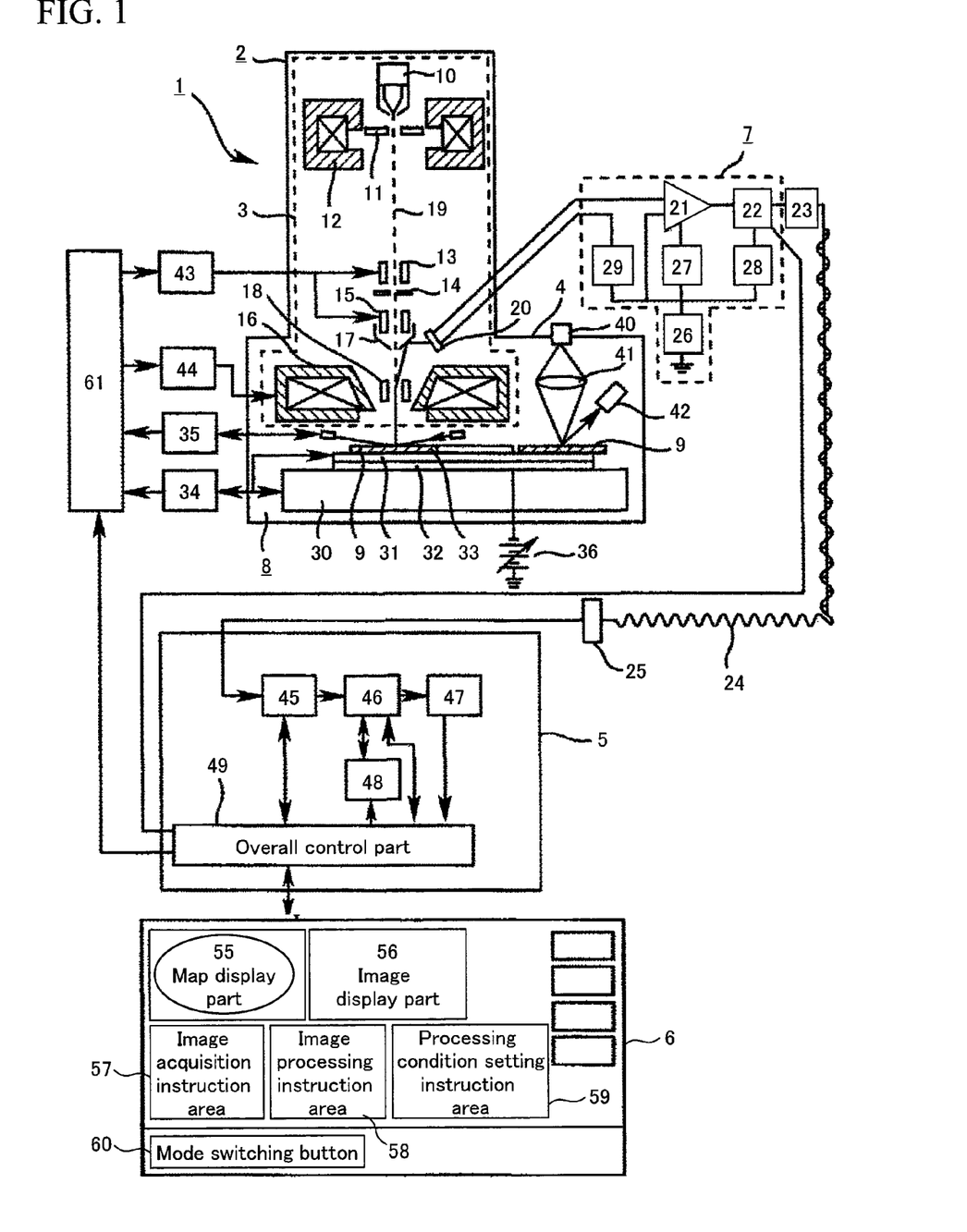
FIG. 1 is a block diagram of a circuit pattern inspection apparatus using a charged particle beam.

FIG. 1 is a block diagram of a circuit pattern inspection apparatus using a charged particle beam and represents a main constitution by a substantially longitudinal sectional view and a functional diagram. A circuit pattern inspection apparatus 1 includes an inspection chamber 2 from which the air is evacuated and a spare chamber (not shown) for transporting an inspected substrate 9 into the inspection chamber 2, and the spare chamber is constructed such that the air can be evacuated therefrom independently of the inspection chamber 2. In addition to the inspection chamber 2 and the spare chamber, the circuit pattern inspection apparatus 1 includes an image processing part 5.

The inspection chamber 2 mainly comprises an electron-optical column 3, a sample chamber 8, and an optical microscope chamber 4. The electron-optical column 3 includes an electron gun 10, electron beam induction electrodes 11, a condensing lens 12, a blanking deflector 13, a diaphragm 14, a scanning deflector 15, an objective lens 16, a reflector 17, an E×B deflector 18, and a secondary electron detector 20, and irradiates the inspected substrate 9 with a primary electron beam 19 and detects secondary electrons generated from the inspected substrate 9.

The optical microscope chamber 4 is arranged near the electron-optical column 3 inside the inspection chamber 2 and apart from the inspection chamber 2 so as not to be mutually affected. The optical microscope chamber 4 includes a light source 40, an optical lens 41, and a CCD camera 42. The distance between the electron-optical column 3 and the optical microscope chamber 4 is known, and an X stage 31 or a Y stage 32 moves reciprocatingly across the known distance between the electron-optical column 3 and the optical microscope chamber 4.

A secondary electron detection part 7 includes a preamplifier 21 for amplifying an output signal from the secondary electron detector 20, an AD converter 22 for converting an amplified signal from an analog signal into a digital signal, a preamplifier driving power supply 27 and an AD converter driving power supply 28 for driving them respectively, a reverse bias power supply 29, and a high-voltage power supply 26 for supplying electricity to these power supplies. An amplified digital signal is converted into an optical signal by a light conversion means 23 and the optical signal passes through an optical transmission means 24 and is converted into an electric signal by an electrical conversion means 25 before being sent to a storage unit 45 of the image processing part 5. Though not shown, an optical image acquired by the CCD camera 42 is also sent to the image processing part 5 in the same manner.

The image processing part 5 includes the storage unit 45, an image processing circuit 46, a defect data buffer 47, an operation part 48, and an overall control part 49. A signal stored in the storage unit 45 is converted into images by the image processing circuit 46, which also performs various kinds of image processing such as alignment of images that are specific positions apart, normalization of signal levels, and removal of signal noise and performs a comparison operation of image signals. The operation part 48 compares an absolute value of a differential image signal obtained after the comparison operation with a predetermined threshold and judges the image signals to be defect candidates if the differential image signal level is larger than the predetermined threshold before sending positions thereof, the number of defects and the like to the interface 6. The overall control part 49 controls the image processing and operations before sending such states to a correction control circuit 61.

An electron beam image or optical image is displayed in an image display part 56 of the interface 6. Operation instructions and operation conditions of each part of the circuit pattern inspection apparatus 1 are input from the interface 6 before being sent to the correction control circuit 61 from the overall control part 49 of the image processing part 5. Conditions of an accelerating voltage, deflection width, and deflection speed when the primary electron beam 19 is generated, timing of capturing a signal by the secondary electron detection part 7, movement speed of the X stage 31 and the Y stage 32 and the like can be set in the interface 6 optionally or selectively in accordance with purposes. The interface 6 has, for example, a function of display and a distribution of a plurality of detected defects is displayed on a map schematically representing a wafer, with symbols in a map display part 55. An image acquisition instruction area 57 is a part for issuing instructions to acquire electron beam images or optical images for each detected defect or area. An image processing instruction area 58 is a part for instructing brightness adjustments or contrast adjustments of an acquired image. A processing condition setting instruction part 59 is a part for setting various conditions such as the deflection width, deflection speed, and focal length and focal depth of an objective lens when the inspected substrate 9 is irradiated with the primary electron beam 19.

The correction control circuit 61 exercises control so that the accelerating voltage, deflection width, and deflection speed when the primary electron beam 19 is generated, timing of capturing a signal by the secondary electron detection part 7, movement speed of the X stage 31 and the Y stage 32, and the like follow instructions sent from the overall control part 49 of the image processing part 5. The correction control circuit 61 also monitors the position and height of the inspected substrate 9 from signals of a position monitor length measuring machine 34 and an inspected substrate height measuring device 35, generates a correction signal based on a result thereof, sends the correction signal to a scanning signal generator 43 and an objective lens power supply 44, and changes the deflection width, deflection speed, and focal length and focal depth of an objective lens so that the primary electron beam 19 is irradiated with on a correct position.

A diffusion/re-supply type thermal field-emission electron source is used as the electron gun 10. A stable electron beam current can be secured by using the electron gun 10, as compared, for example, with a conventional tungsten (W) filament electron source and a cold field-emission electron source and therefore, electron beam images with less fluctuations in brightness can be obtained. Moreover, the electron beam current can be set to be large with the electron gun 10 and therefore, a high-speed inspection described later can be carried out.

The primary electron beam 19 is withdrawn from the electron gun 10 by applying a voltage to between the electron gun 10 and the electron beam induction electrodes 11. Acceleration of the primary electron beam 19 is determined by applying a high-voltage negative potential to the electron gun 10. Accordingly, the primary electron beam 19 travels toward a sample stand 30 with energy corresponding to the potential thereof and is converged by the condensing lens 12 and further thinly narrowed down by the objective lens 16 before being irradiated with on the subjected substrate 9 on the sample stand 30.

The blanking deflector 13 and the scanning deflector 15 are controlled by the scanning signal generator 43 that generates a blanking signal and a scanning signal. The blanking deflector 13 can deflect the primary electron beam 19 so that the primary electron beam 19 does not pass through an opening of the diaphragm 14 to prevent irradiation of the inspected substrate 9 with the primary electron beam 19. Since the primary electron beam 19 is thinly narrowed down by the objective lens 16, the primary electron beam 19 is caused to scan on the inspected substrate 9 by the scanning deflector 15.

A fast inspection speed is required for an automatic inspection apparatus. Therefore, unlike a normal SEM, a low-speed scan of an electron beam of an electron beam current on the order of pA, a repetitive scan, and superposition of respective images are not performed. Also in order to inhibit insulating material from being charged, an electron beam scan needs to be fast and limited to once or several times. Thus, in the present embodiment, an image is formed by performing a scan of a large-current electron beam of, for example, 100 nA, which is about 100 times or more that of a normal SEM, only once. The scan width is set, for example, to 100 μm, one pixel to 0.1 square-μm, and one scan is performed in 1 μs.

The objective lens power supply 44 is connected to the objective lens 16. A lens power supply (not shown) is also connected to the condensing lens 12. Intensity of these lenses is adjusted by the correction control circuit 61 by changing the voltage of the lens power supply.

A negative voltage can be applied to the inspected substrate 9 by a retarding power supply 36. By adjusting the voltage of the retarding power supply 36, the primary electron beam 19 is decelerated so that electron beam irradiation energy to the inspected substrate 9 can be adjusted without changing the potential of the electron gun 10.

The inspected substrate 9 is placed on the X stage 31 or the Y stage 32. A method by which the X stage 31 and the Y stage 32 are put to rest when an inspection is carried out and the primary electron beam 19 is scanned with two-dimensionally and another method by which the X stage 31 is put to rest and the primary electron beam 19 is scanned with in the X direction while the Y stage 32 being moved continuously at a constant speed are known. When a specific and relatively small area is inspected, the former method by which the stages are put to rest for inspection is effective and when a relatively large area is inspected, the latter method by which the stage is continuously moved at a constant speed is effective.

When an image of the inspected substrate 9 is acquired while one of the X stage 31 and the Y stage 32 being moved continuously, the primary electron beam 19 is scanned with in a direction substantially perpendicular to the direction of movement of the stage and secondary electrons generated from the inspected substrate 9 are detected by the secondary electron detector 20 in synchronization with scanning of the primary electron beam 19 and movement of the stage. Secondary electrons generated by the inspected substrate 9 being irradiated with the primary electron beam 19 are accelerated by a negative voltage applied to the inspected substrate 9. The E×B deflector 18 is arranged above the inspected substrate 9, thereby deflecting accelerated secondary electrons in a predetermined direction. The amount of deflection can be adjusted by changing the intensity of magnetic field with a voltage applied to the E×B deflector 18. An electromagnetic field of the E×B deflector 18 can be made variable in coordination with a negative voltage applied to the inspected substrate 9. Secondary electrons deflected by the E×B deflector 18 collide against the reflector 17 under predetermined conditions. The reflector 17 serves also as a shield pipe of the scanning deflector 15 of the primary electron beam 19 irradiated with on the inspected substrate 9 and has a conical shape. When accelerated secondary electrons collide against the reflector 17, second secondary electrons having energy of several V to 50 eV are generated from the reflector 17.

In the present embodiment, the position monitor length measuring machine 34 is constructed such that it uses a length measuring machine based on the principle of laser interference in the X and Y directions and measures positions of the X stage 31 and the Y stage 32 while the primary electron beam 19 being irradiated with, to send the positions to the correction control circuit 61. Moreover, the number of rotations of each driving motor of the X stage 31, the Y stage 32, and a rotation stage 33 is sent to the correction control circuit 61 from the respective driver circuit. The correction control circuit 61 can correctly grasp the area or position on which the primary electron beam 19 is irradiated with based on the above data and corrects position displacements of the irradiation position of the primary electron beam 19. The correction control circuit 61 can also store the area on which the primary electron beam 19 has been irradiated with.

An optical measuring device using a measurement method other than an electron beam, for example, a laser interference measuring device or a reflected light type measuring device for measuring changes based on the position of reflected light is used as the inspected substrate height measuring device 35. For example, a method by which the inspected substrate 9 is irradiated with an elongated white light after passing through a slit through a window and, the position of the reflected light is detected by a position detection monitor, and the amount of changes in height is calculated from position fluctuations is known. The inspected substrate height measuring device 35 is mounted on the X stage 31 and the Y stage 32 to measure the height of the inspected substrate 9. The focal length of the objective lens 16 for thinly narrowing down the primary electron beam 19 is dynamically corrected based on data measured with the inspected substrate height measuring device 35 so that the primary electron beam 19 always focused on an inspected area can be irradiated with. Moreover, by measuring warping and height distortion of the inspected substrate 9 before irradiation of the primary electron beam 19, correction conditions of the objective lens 16 for each inspection area can be set based on the resultant data.

Figure 2:
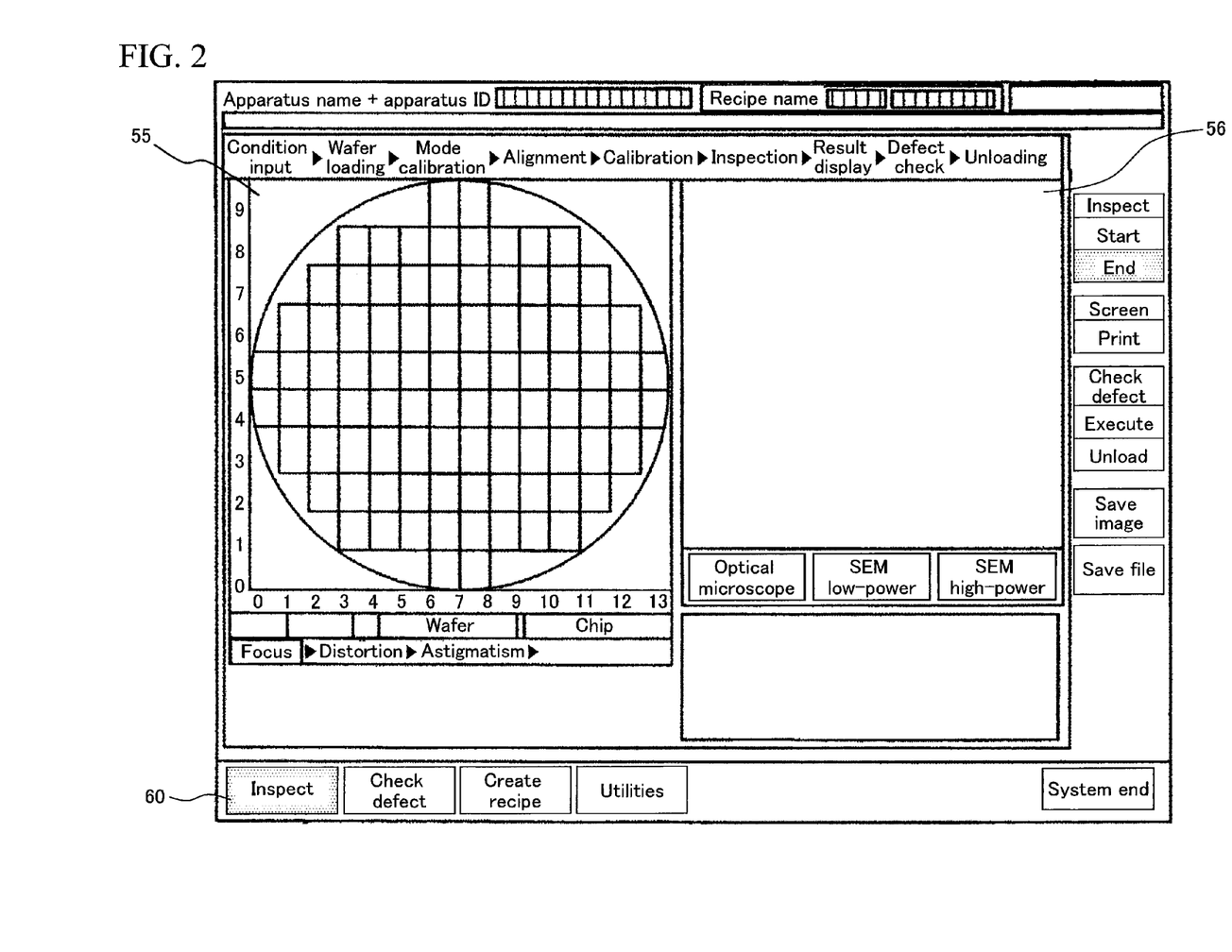
FIG. 2 is a screen diagram exemplifying a screen displayed in an interface display.

FIG. 2 is a screen diagram exemplifying a screen displayed in an interface display. A map display part 55 and an image display part 56 are arranged in a large area of the display screen. A mode switching button 60 is arranged at the bottom and each mode of "Inspect", "Check defect", "Create recipe", and "Utilities" can be selected. The "Create recipe" mode is a mode for setting conditions for automatic inspection. The "Utilities" mode is a mode for invoking an auxiliary function that does not appear in other modes and is not usually used.

Figure 3:
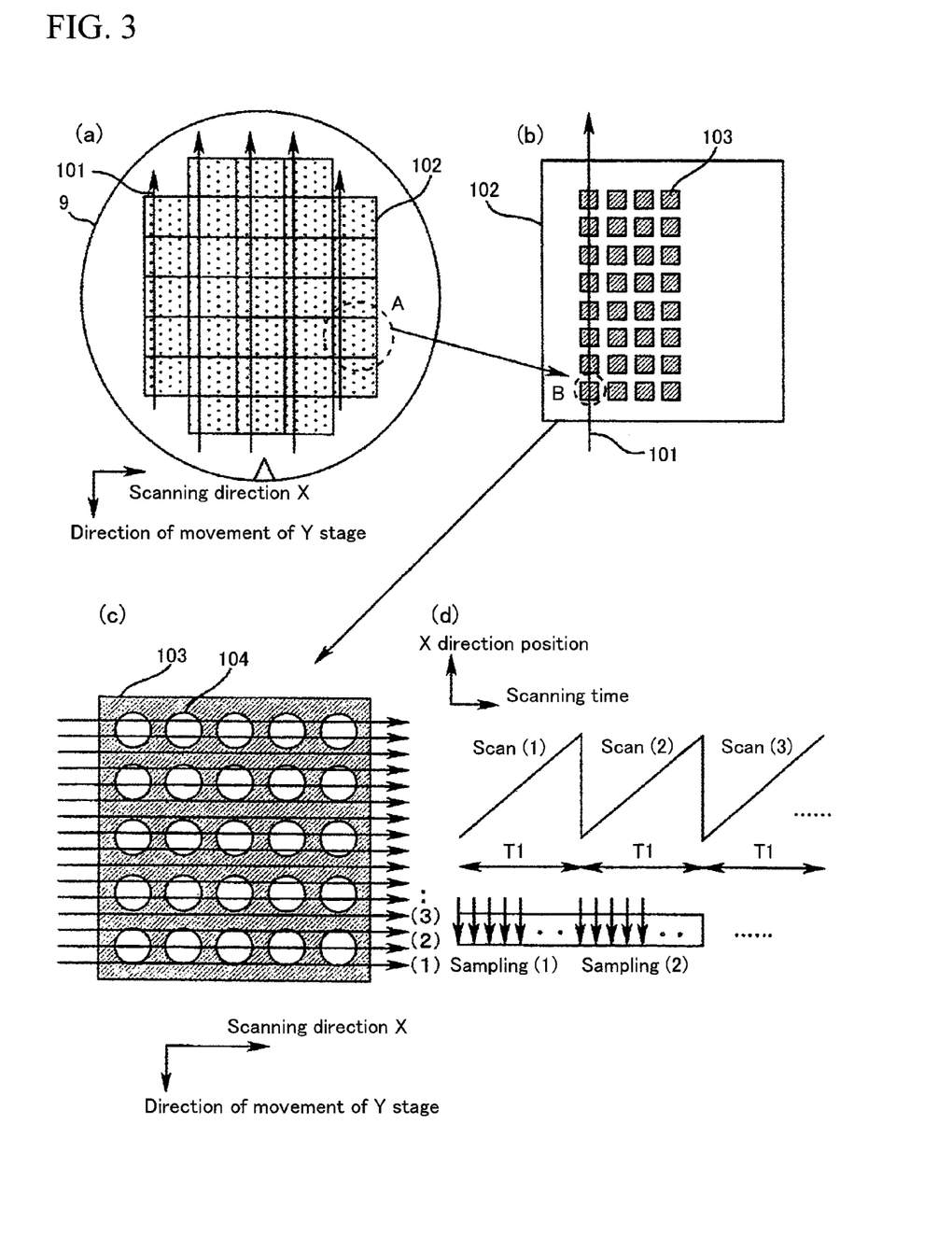
FIG. 3 is a conceptual diagram illustrating control of scanning an inspected substrate with a primary electron beam.

FIG. 3 is a conceptual diagram illustrating control of scanning the inspected substrate 9 with the primary electron beam 19. FIG. 3A is a plan view of the inspected substrate 9, FIG. 3B is an enlarged view of an A portion of FIG. 3A, FIG. 3C is an enlarged view of a B portion of FIG. 3B, and FIG. 3D is a relational diagram showing a relationship between a scanning time of the primary electron beam 19 and the position in the X direction.

As shown in FIG. 3A, the primary electron beam 19 is caused to scan in a direction perpendicular to the direction of movement of the stage while the stage being moved. Since the stage is moving, the primary electron beam 19 travels in the direction of an inspection stripe 101 denoted by arrows in the figure while scanning on the inspected substrate 9. Each rectangle represents a chip 102. A final product of it is cut off along boundary lines between rectangles and then is bonded to electric terminals.

FIG. 3B is an enlargement of one chip 102 enclosed by the A portion in FIG. 3A, and a plurality of cells 103 are arranged therein. If the width of scanning of the primary electron beam 19 is 100 μm and that of the cell 103 is 100 μm or less, one column of the cells 103 will be scanned in one stage movement.

FIG. 3C is an enlargement of the B portion in FIG. 3B and shows a situation in which a plurality of circuits called plugs 104 is arranged in one cell 103. The cell 103 is scanned with the primary electron beam 19 in turn like in the order of sampling (1), sampling (2), sampling (3), and generated secondary electrons are detected at the same time before being converted into images.

FIG. 3D is a relational diagram showing a relationship between the scanning time of the primary electron beam 19 and the position in the X direction, and the scanning time for sampling (1) is defined as a T1 time (for example, 1 μs) and this is repeated as a time interval between irradiations (hereinafter, referred to as an irradiation interval).

By controlling the irradiation interval and the irradiation position in the movement axis direction in real time in accordance with an electrification state of the inspection target, precision of transport means, or inspection purposes, quality of inspection images to be detected and throughput of the inspection can be improved. This is called an adjustment function and an example thereof will be shown below.

A method of carrying out an inspection by continuously moving at a constant speed a stage that moves an inspection target is taken as an example. It is assumed that the stage moves in the Y direction and the primary electron beam 19 is scanned with in the X direction (substantially perpendicular to the direction of movement). In the inspection method, the primary electron beam 19 can be controlled by adjusting the amount of Y deflection and the irradiation interval, and the following four control methods can be considered: (1) a method in which both the amount of Y deflection and the irradiation interval are fixed, (2) a method in which the amount of Y deflection is fixed and the irradiation interval is adjusted, (3) a method in which the amount of Y deflection is adjusted and the irradiation interval is fixed, and (4) a method in which both the amount of Y deflection and the irradiation interval are adjusted.

Figure 4:
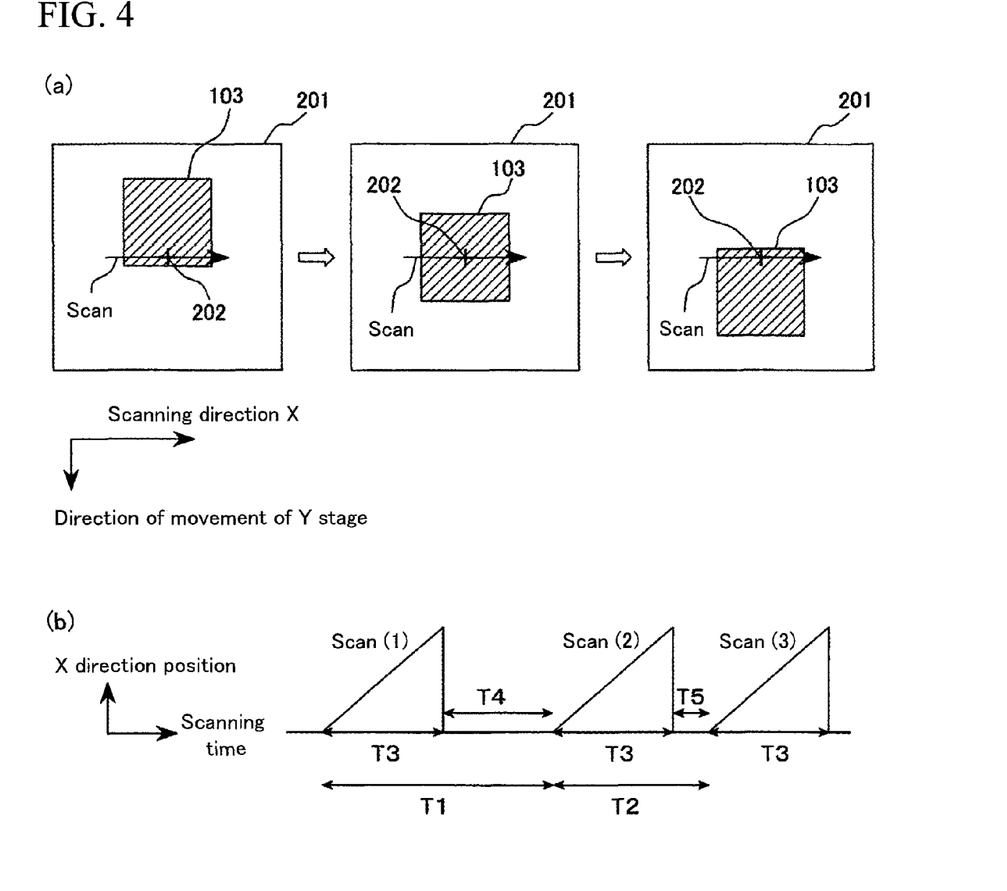
FIG. 4 is a conceptual diagram illustrating control of scanning the inspected substrate with the primary electron beam.

The control method (1) will be described using FIG. 4. A in FIG. 4 is a conceptual diagram illustrating the irradiation position of an electron beam when viewed from a deflecting view field 201, and A in FIG. 4 shows a state in which the primary electron beam 19 is irradiated with such that it always passes through a center 202 of the deflecting view field 201. B in FIG. 4 is a relational diagram showing a relationship among the scanning time and wait time of the primary electron beam 19 and the position in the X direction in this method, and it is assumed that the scanning time T1 is an irradiation interval between scan (1) and scan (2) and the scanning time T2 is an irradiation interval between scan (2) and scan (3). When the scanning time T3 is controlled unchangeably, wait times T4 and T5 for their respective irradiations are made uniform by making a scan so that T1 and T2 become equal.

By making the irradiation interval constant just like the control method (1), it becomes possible to make the electrification state uniform and suppress an occurrence of contrast unevenness. Moreover, by making the amount of Y deflection constant, correction processing for focus distortion and the like due to deflection in the Y direction, processing of determining whether or not within the deflecting view field, and the like are made unnecessary, contributing to enhancement of reliability and processing speed and improvement of throughput due to simplification of processing.

Figure 5:
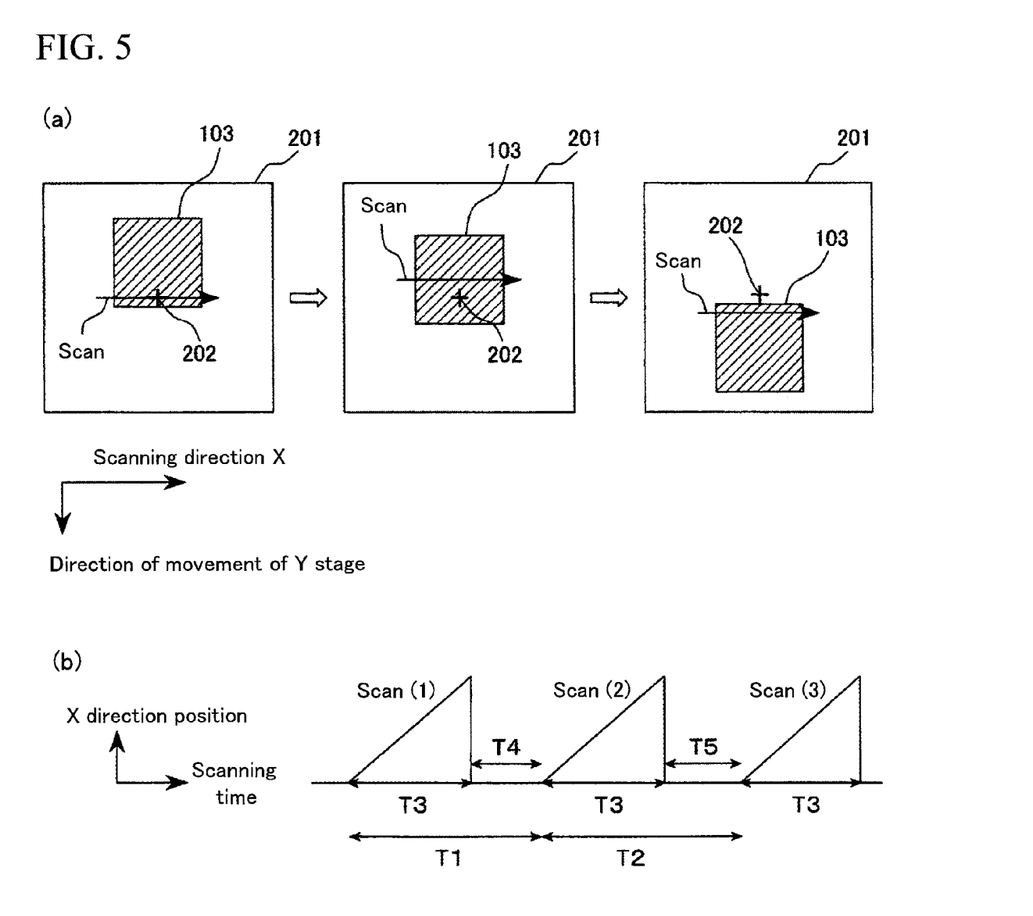
FIG. 5 is a conceptual diagram illustrating control of scanning the inspected substrate with the primary electron beam.

The control method (2) will be described using FIG. 5. Like A in FIG. 4, A in FIG. 5 is a conceptual diagram illustrating the irradiation position of an electron beam when viewed from the deflecting view field 201, and A in FIG. 5 shows a state in which the primary electron beam 19 is irradiated with such that it always passes through the center 202 of the deflecting view field 201. Like B in FIG. 4, B in FIG. 5 is a relational diagram showing a relationship among the scanning time and wait time of the primary electron beam 19 and the position in the X direction in the method, and it is assumed that the scanning time T1 is an irradiation interval between scan (1) and scan (2) and the scanning time T2 is an irradiation interval between scan (2) and scan (3). When the scanning time T3 is controlled unchangeably, the irradiation intervals T1 and T2 are changed when necessary.

By making the irradiation interval variable just like the control method (2), it becomes possible to absorb unevenness of the stage speed and improve precision of the irradiation position of an electron beam. Moreover, like the control method (1), it is possible to contribute to enhancement of reliability and processing speed and improvement of throughput, by making the amount of Y deflection constant.

Figure 6:
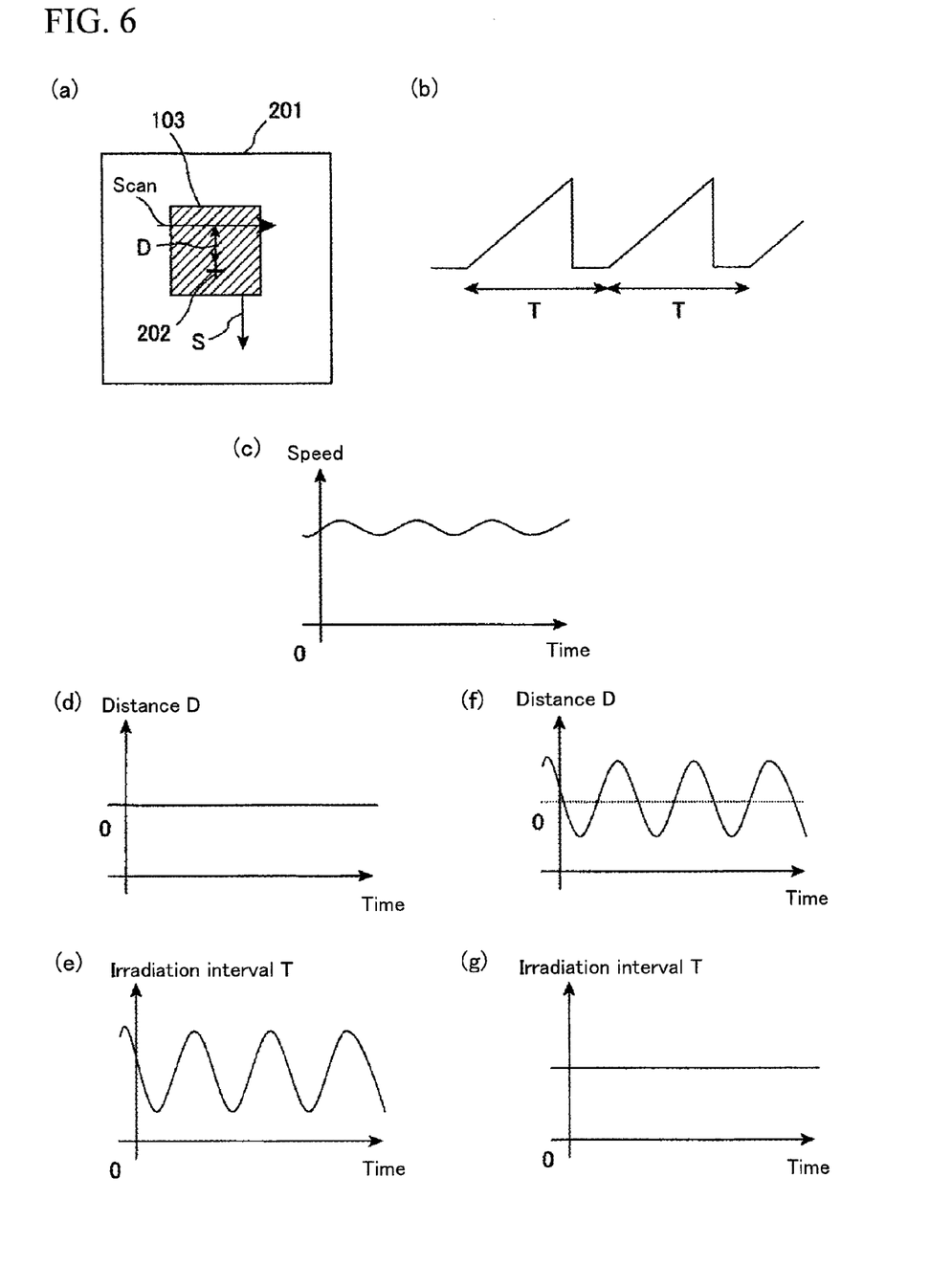
FIG. 6 is a conceptual diagram illustrating control of scanning the inspected substrate with a primary electron beam.

The control method (3) will be described using FIG. 6. Like A in FIG. 5, A in FIG. 6 is a conceptual diagram illustrating the irradiation position of an electron beam when viewed from the deflecting view field 201, and A in FIG. 6 shows a state in which the primary electron beam 19 is irradiated with, being deflected also in the Y direction according to circumstances so that the primary electron beam 19 is irradiated with on the irradiation target position on the cell 103, which is the inspection target. Like B in FIG. 4, B in FIG. 6 is a relational diagram showing a relationship among the scanning time and wait time of the primary electron beam 19 and the position in the X direction in this method, and it is assumed that the scanning time T1 is an irradiation interval between scan (1) and scan (2) and the scanning time T2 is an irradiation interval between scan (2) and scan (3). B in FIG. 6 shows a state in which a scan is performed so that T1 and T2 become equal.

Like the control method (1), by making the irradiation interval constant just like the control method (3), it becomes possible to make the electrification state uniform and suppress an occurrence of contrast unevenness. Moreover, by adjusting the amount of Y deflection according to circumstances, it becomes possible to absorb unevenness of the stage speed and improve precision of the irradiation position of an electron beam.

Figure 7:
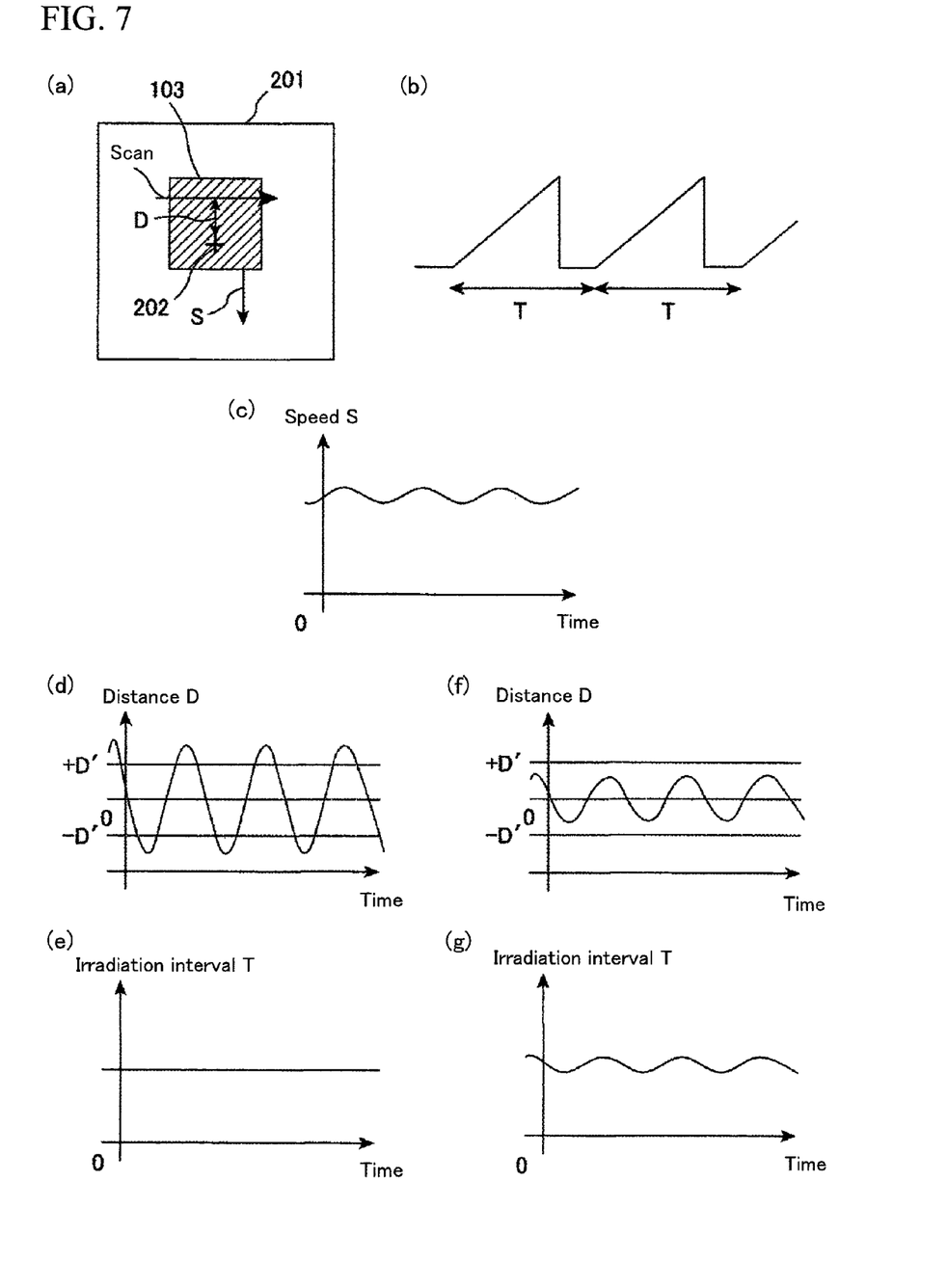
FIG. 7 is a conceptual diagram illustrating control of scanning the inspected substrate with the primary electron beam.

The control method (4) will be described using FIG. 7. Like A in FIG. 6, A in FIG. 7 is a conceptual diagram illustrating the irradiation position of an electron beam when viewed from the deflecting view field 201, and A in FIG. 7 shows a state in which the primary electron beam 19 is irradiated with, being deflected also in the Y direction according to circumstances so that the primary electron beam 19 is irradiated with on the irradiation target position on the cell 103, which is the inspection target. Like B in FIG. 5, B in FIG. 7 is a relational diagram showing a relationship among the scanning time and wait time of the primary electron beam 19 and the position in the X direction in the method, and it is assumed that the scanning time T1 is an irradiation interval between scan (1) and scan (2) and the scanning time T2 is an irradiation interval between scan (2) and scan (3). When the scanning time T3 is controlled unchangeably, the irradiation intervals T1 and T2 are changed when necessary.

By adjusting both the irradiation interval and the amount of Y deflection just like the control method (4), it becomes possible to absorb unevenness of the stage speed and improve precision of the irradiation position of an electron beam. Also, by adjusting both, their respective amount of adjustments can be suppressed, and also effects of both preventing deviation of the irradiation position of an electron beam from the deflecting view field and suppressing an occurrence of contrast unevenness by uniformity of the electrification state can be expected.

Figure 8:
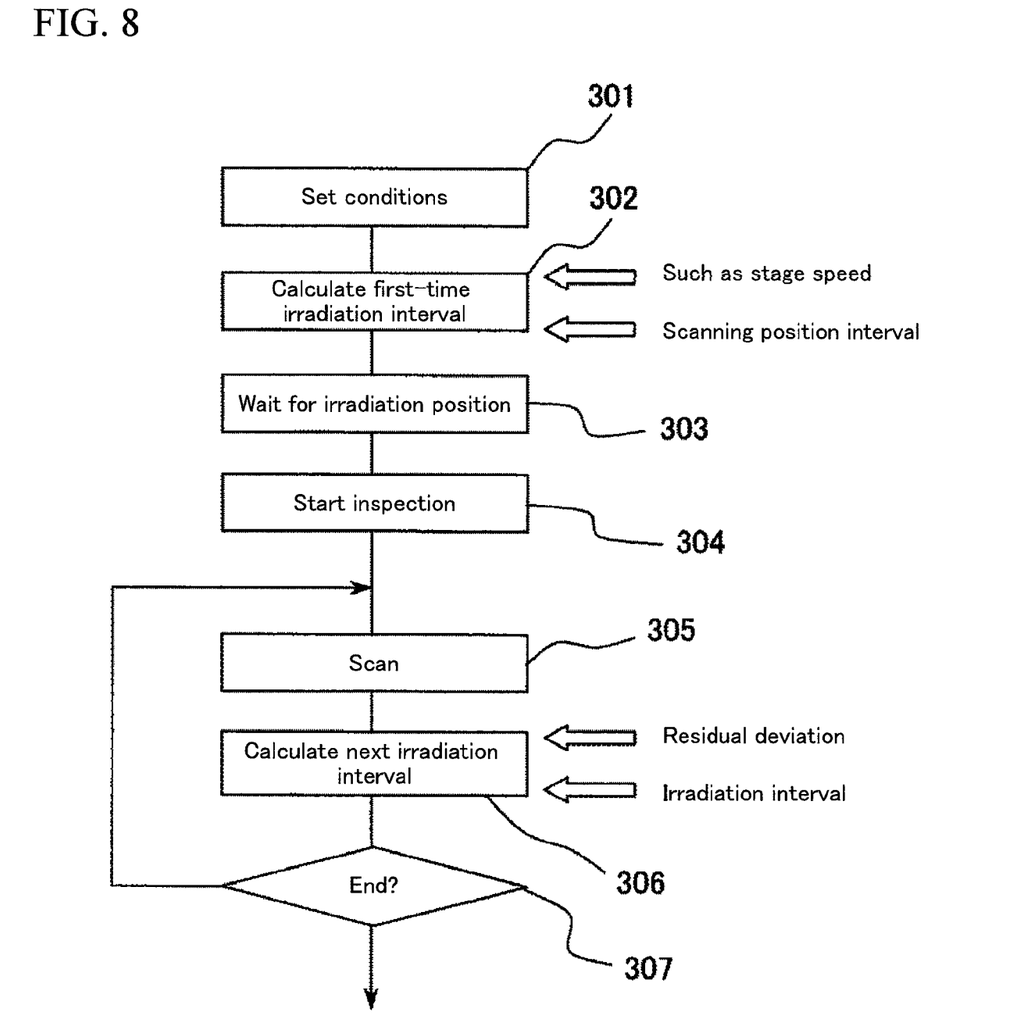
FIG. 8 is a conceptual diagram illustrating a control flow of a stabilization function.

FIG. 8 shows a processing flow of an adjustment function of the amount of Y deflection and irradiation interval. Conditions for the adjustment function are set by an operator (step 301), first-time irradiation conditions such as the amount of Y deflection and irradiation interval are calculated based on the conditions and other apparatus operation conditions such as the stage speed (step 302), and when the irradiation target position of the initial scan reaches the vicinity of the position indicated by the amount of Y deflection (step 303), an inspection by the initial scan is started (step 304). When irradiation conditions such as the passage of irradiation interval and arrival at the irradiation target position are met and a scan is performed (step 305), the irradiation interval and amount of Y deflection fluctuate depending on both various factors such as stage speed fluctuations and adjustments of the irradiation interval and amount of Y deflection. Irradiation conditions such as the next amount of Y deflection and irradiation interval are calculated with input values such as the new irradiation interval and amount of Y deflection and the irradiation target position with respect to the deflecting view field (step 306). The scanning step 305 and calculation of irradiation conditions are repeated until a scan of any number of lines is completed to end the inspection (step 307).

Figure 9:
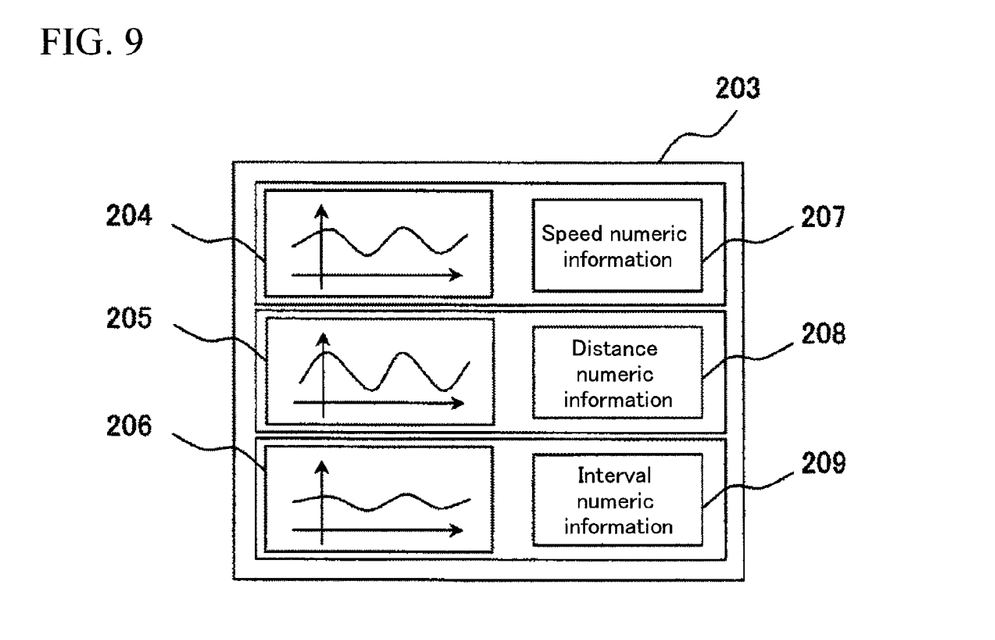
FIG. 9 is a screen diagram exemplifying an interface for monitoring an electron beam scanning adjustment function.

In addition to monitoring of the amount of Y deflection and irradiation interval, parameters for adjusting the amount of Y deflection and irradiation interval need to be optimized for each scan condition and thus, an adjustment interface is needed. The stage speed, amount of Y deflection, and irradiation interval are displayed in a processing condition setting instruction part 59 on the interface 6 or another screen for monitoring the amount of Y deflection and irradiation interval. FIG. 9 is an example of a monitoring screen 203 for monitoring the amount of Y deflection and irradiation interval in which the stage speed is displayed in a stage speed change display part 204, the amount of Y deflection in a Y deflection amount change display part 205, and the time interval between irradiations in an irradiation interval change display part 206 as graphs of transitions of their respective states. Furthermore, their respective numerical values can be displayed in a speed numeric information display part 207, a distance numeric information display part 208 and an interval numeric information display part 209.

Figure 10:
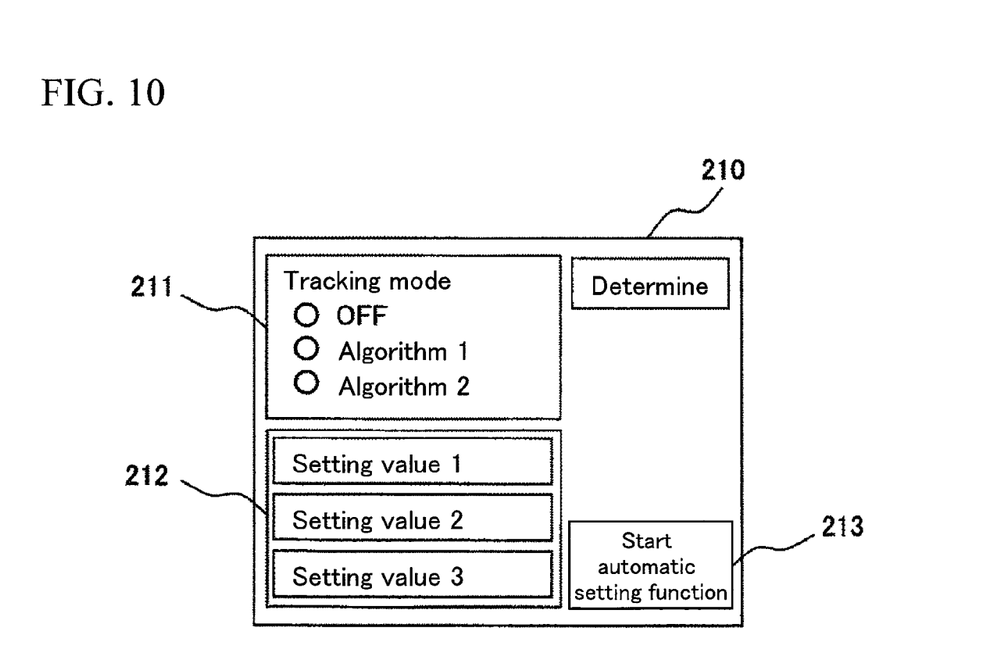
FIG. 10 is a screen diagram exemplifying an interface for setting/specifying conditions of the electron beam scanning adjustment function.

FIG. 10 is an example of a condition instruction screen 210 of the amount of Y deflection and irradiation interval or adjustments of control thereof, and a tracking mode selection part 211 enables or disables the adjustment function of the amount of Y deflection and irradiation interval or makes algorithms, such as a feedback algorithm, for realizing the function, selectable. A setting value input part 212 makes input of parameters corresponding to the tracking mode possible. An automatic setting function start button 213 starts an auxiliary setting function.

For example, when both the amount of Y deflection and irradiation interval, which are in a trade-off relationship, are adjusted and controlled, it is sometimes difficult to make adjustments for optimizing control of the amount of Y deflection and irradiation interval, and work efficiency of optimization of control parameters can be improved by displaying transitions of both the amount of Y deflection and irradiation interval. The auxiliary start function can be considered, which has optimal parameters automatically determined from the amount of Y deflection and irradiation interval by repeatedly performing a scan with different parameters without actually irradiating with a primary electron beam.

Thus, it becomes possible to reduce both fluctuations in contrast of detected images and distortion of images and to improve detection throughput by applying the deflection control method properly in accordance with apparatus conditions, inspection targets, and purposes.

What is claimed is:
1. A charged particle beam apparatus for generating an image of an observation target by irradiating the observation target with a charged particle beam and detecting a generated secondary signal, comprising:
   a stage that moves continuously along a movement direction with the observation target placed thereon; and a deflection control circuit for providing a deflector with a scanning signal that causes the charged particle beam to scan along at least one scanning line which intersects the movement direction of the stage; wherein:

said deflection control circuit further controls an amount of a deflection of the charged particle beam in the movement direction of the stage depending on a fluctuation of speed of the stage, and irradiation intervals between scanning lines are adjustable depending on the fluctuation of the speed of the stage.

2. The charged particle beam apparatus according to claim 1, wherein the deflection control circuit controls the deflection of the charged particle beam in the movement direction of the stage in accordance with changes in movement speed of the stage or changes in distance from a specific position in a deflecting view field to a scanning position.

3. The charged particle beam apparatus according to claim 2, wherein the amount of deflection in the movement direction is adjusted simultaneously with repetition of a scan of each scanning line or plurality of scanning lines of the charged particle beam.

4. The charged particle beam apparatus according to claim 2, further comprising:

a user interface for displaying the amount of deflection in the movement direction.

5. The charged particle beam apparatus according to claim 1, wherein the deflection control circuit controls a time interval between irradiations of the charged particle beam in accordance with changes in movement speed of the stage or changes in distance from a specific position in a deflecting view field to a scanning position.

6. The charged particle beam apparatus according to claim 5, wherein the time interval between irradiations of the charged particle beam is adjusted simultaneously with repetition of a scan of each scanning line or plurality of scanning lines of the charged particle beam.

7. The charged particle beam apparatus according to claim 5, further comprising a user interface for displaying the time interval between irradiations of the charged particle beam.

8. The charged particle beam apparatus according to claim 1, further comprising:

a condition instruction interface for controlling both deflection of the charged particle beam in the movement direction and repetition of a scan in a direction which intersects the movement direction.

9. The charged particle beam apparatus according to claim 8, further comprising:

an automatic setting function for assisting in condition instructions for controlling the deflection and the scan repetition.

10. An image generation method in a charged particle beam apparatus for generating an image of an observation target by irradiating the observation target with a charged particle beam and detecting a generated secondary signal, comprising the steps of:

moving the observation target continuously along a movement direction by a stage; and providing a deflector with a scanning signal that causes the charged particle beam to scan in a direction which intersects the movement direction; wherein:

an amount of said deflection of the charged particle beam in the movement direction of the stage is controlled depending on a fluctuation of speed of the stage, and irradiation intervals between scanning lines are adjustable depending on the fluctuation of the speed of the stage.

* * * * *